United States Patent
Wu et al.

(10) Patent No.: US 10,013,035 B2
(45) Date of Patent: Jul. 3, 2018

(54) TESTING METHOD AND ELECTRONIC DEVICE

(71) Applicant: GETAC TECHNOLOGY CORPORATION, Hsinchu County (TW)

(72) Inventors: Chi-Jung Wu, New Taipei (TW); Chun-Yu Kuo, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 393 days.

(21) Appl. No.: 14/793,501

(22) Filed: Jul. 7, 2015

(65) Prior Publication Data
US 2017/0010643 A1    Jan. 12, 2017

(51) Int. Cl.
*G06F 1/20*  (2006.01)
*G05B 19/048*  (2006.01)

(52) U.S. Cl.
CPC .......... *G06F 1/206* (2013.01); *G05B 19/048* (2013.01); *G05B 2219/24058* (2013.01); *G05B 2219/49219* (2013.01)

(58) Field of Classification Search
CPC ............... G06F 1/206; G05B 19/048; G05B 2219/49219; G05B 2219/24058
See application file for complete search history.

(56) References Cited

U.S. PATENT DOCUMENTS

| | | | | |
|---|---|---|---|---|
| 2003/0037193 A1* | 2/2003 | Larson | ................. | G06F 11/24 710/200 |
| 2005/0071117 A1* | 3/2005 | Escobar | ............... | G11B 25/043 702/132 |
| 2005/0278560 A1* | 12/2005 | Wu | ....................... | G06F 1/3203 713/320 |
| 2007/0219644 A1* | 9/2007 | Sonobe | ................... | G06F 1/206 700/12 |
| 2013/0031390 A1* | 1/2013 | Smith, III | ............... | G06F 1/206 713/320 |
| 2014/0181562 A1* | 6/2014 | Das | ........................ | G06F 1/206 713/324 |

* cited by examiner

*Primary Examiner* — Kenneth M Lo
*Assistant Examiner* — David J Wynne

(57) ABSTRACT

A testing method adapted for an electronic device operating an operating system at a particular temperature environment is provided. The method includes the steps of: determining whether an operating command is received; when the operating command is received, deriving a test, executing the test, and disabling a fan of the electronic device, wherein the test corresponds to one of a plurality of system states of an operating system, and includes a temperature threshold value corresponding to the system state and an entering action of the system state; and when the system state of the test corresponds to a work mode of the operating system, the test includes: continuously monitoring a temperature value of the central processing unit; and when the temperature value of the central processing unit reaches the temperature threshold value, enabling the fan and executing the entering action of the system state.

20 Claims, 3 Drawing Sheets

Determine whether an operating command is received — S101

Derive a test, execute the test, and disable a fan of an electronic device when an operating command is received — S102

TESTING METHOD AND ELECTRONIC DEVICE

BACKGROUND OF THE INVENTION

Field of the Invention

The invention relates to an electronic device, and more particularly, to an electron device and a testing method of an electronic device.

Description of Related Art

For an electronic device such as a personal computer, a notebook computer, or a tablet computer, the designer of the electronic device generally sets one or a plurality of upper limits and lower limits of temperature. Therefore, when a heat-emitting element such as a central processing unit (CPU) of the electronic device reaches the upper limit or the lower limit of temperature, a protection mechanism is triggered and then the operating system of the electronic device enters a sleep mode or a power off mode. Such that the electronic elements in the electronic device are not damaged because of operation under an extreme temperature environment (such as over 100° C. or lower than −20° C.). For relatively strict specifications or standards, such as in terms of a product with industrial or military specifications of each nation, the upper limit or the lower limit of temperature in the protection mechanism is closer to the physical limit of each electronic element in the electronic device. If the electronic device cannot be shutdown or enters a sleep mode when the internal temperature of the electronic device is increased to the upper limit or the lower limit of temperature, permanent damage will occur to the electronic device. Therefore, the designer and the producer of the electronic device need to perform a test on the electronic device before shipment to ensure a heat-emitting element such as CPU of the electronic device can operate correctly when the temperature reaches the above upper limit or lower limit of temperature (such as cutting off power or entering a sleep mode). In general, the current testing method includes rapidly increasing the temperature of the CPU via strategies such as removing the heat sink of the CPU or disabling a fan corresponding to the CPU. In the case that the heat sink is removed, since the CPU loses the cooling mechanism, the temperature of the CPU is increased too fast, and therefore the protection mechanism cannot be correctly and accurately executed in stages, and a false positive due to human error readily occurs. In the case that the fan is disabled, a false positive of the protection mechanism also readily occurs and the testing environment is different from the original environment for the user. Therefore, how to complete the test via the current elements in the electronic device is an issue to be solved by those having ordinary skill in the art.

SUMMARY OF THE INVENTION

The invention provides a testing method and an electronic device, such that the process of a test of the electronic device in a harsh environment can be simplified, and false positive of protection mechanism caused by human error can be effectively reduced.

A testing method of the invention is adapted for an electronic device operating an operating system at a particular temperature environment, and includes the following steps. First, whether an operating command is received is determined. Then, when the operating command is received, a test is derived, the test is executed, and a fan of the electronic device is disabled, wherein the test corresponds to one of a plurality of system states of an operating system, and includes a temperature threshold value corresponding to the system state and an entering action of the system state. In particular, when the system state of the test corresponds to a work mode of the operating system, the test includes: continuously monitoring a temperature value of a central processing unit of the electronic device; and enabling the fan and executing the entering action of the system state when the temperature value of the central processing unit of the electronic device reaches the temperature threshold value.

An electronic device of the invention includes a CPU, a fan, and a microcontroller. The central processing unit operates an operating system. The fan is fixed adjacent to the CPU. The microcontroller is coupled to the CPU and the fan. In particular, the microcontroller determines whether an operating command is received. When the operating command is received, the microcontroller derives a test, executes the test, and disables the fan, wherein the test corresponds to one of a plurality of system states of the operating system, and includes a temperature threshold value corresponding to the system state and an entering action of the system state. When the system state of the test corresponds to a work mode of the operating system, the test includes: continuously monitoring a temperature value of a central processing unit of the electronic device; and enabling the fan and executing the entering action of the system state when the temperature value of the central processing unit of the electronic device reaches the temperature threshold value.

Based on the above, the invention provides a testing method and an electronic device, such that when the electronic device reaches the temperature threshold value of the test during testing, the fan can be optionally enabled according to whether the test corresponds to the work mode, such that the test can be closer to the state of an extreme environment faced by the electronic device, and at the same time avoid many possible human errors present during testing.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
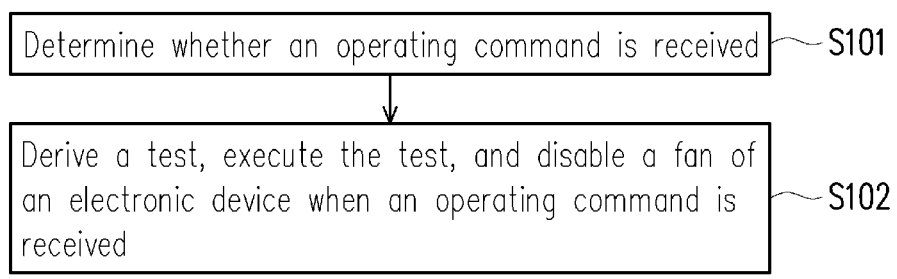
FIG. 1 is a method flowchart of a testing method illustrated according to an embodiment of the invention.

FIG. 1 is a method flow chart of a testing method illustrated according to an embodiment of the invention, wherein the testing method is adapted for an electronic device operating an operating system at a particular temperature environment (such as a high temperature environment or a low temperature environment). Referring to FIG. 1, first, whether an operating command is received is determined (step S101). Then, when the operating command is received, a test is derived, the test is executed, and a fan of an electronic device is disabled (step S102). In particular, the test corresponds to one of a plurality of system states of the operating system, and includes a temperature threshold value corresponding to the system state and an entering action of the system state. In particular, the test includes: continuously monitoring the temperature value of a central processing unit (CPU) of the electronic device; and enabling the fan and executing the entering action of the system state when the temperature value of the CPU of the electronic device reaches the temperature threshold value of the system state.

Figure 2:
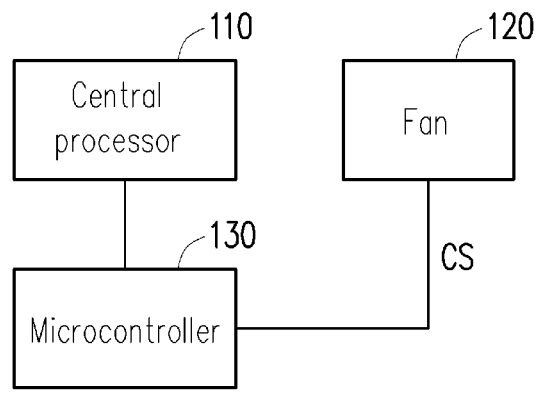
FIG. 2 is a device block diagram of an electronic device illustrated according to an embodiment of the invention.

FIG. 2 is a device block diagram of an electronic device illustrated according to an embodiment of the invention. Referring to FIG. 2, an electronic device 10 includes a CPU 110, a fan 120, and a microcontroller 130. The CPU 110 operates an operating system. The fan 120 is fixed adjacent to the CPU 110. The microcontroller 130 can be an embedded controller (EC) or a keyboard controller (KBC) coupled to the CPU 110 and the fan 120. In particular, the microcontroller 130 determines whether an operating command is received (such as receiving from the CPU 110). When the operating command is received, the microcontroller 130 derives a test, executes the test, and disables the fan. In particular, the test corresponds to one of a plurality of system states of the operating system, and includes a temperature threshold value corresponding to the system state and an entering action of the system state, wherein when the system state of the test corresponds to a work mode of the operating system, the test includes: continuously monitoring the temperature value of the CPU 110 of the electronic device 10; and enabling the fan 120 and executing the entering action of the system state (such as enabling the fan 120 by transmitting a control signal CS to the fan) when the temperature value of the CPU 10 of the electronic device 10 reaches the temperature threshold value corresponding to the system state.

In an embodiment of the invention, the system state includes system states that an operating system to protect operating data from influence such as keeping a sleep mode having varying operating degrees, or even shutting down. In the present embodiment, three tests corresponding to system states of three different temperature threshold values are exemplified. In particular, the first test corresponds to a hibernation mode in the sleep mode. In other words, the action in the first test is: transmitting a control signal to the CPU 110 such that the operating system enters the hibernation mode, and the second test corresponds to a shutdown mode of the operating system. The action in the first test is: transmitting a control signal to the CPU 110 to shut down the operation of the operating system, and such an action can also corresponds to a soft shutdown of the operating system. The hibernation mode described above can correspond to an S4 state in the advanced configuration and power interface (ACPI) standard, and the shutdown mode can correspond to an S5 state, but the invention is not limited thereto. The S4 state and the S5 state corresponding to the system states corresponding to the first test and the second test can also be referred to as the work mode of the operating system. However, the third test does not correspond to the work mode of the operating system, but instead corresponds to a hard shutdown mode. In other words, in the action of the third test, the microcontroller 130 directly cuts off the power output supplied to the CPU 110.

Moreover, the actions corresponding to the above three tests affect the operating system to varying degrees, and therefore the temperature threshold values of the system states corresponding to the three tests are also different. For instance, in the case that the electronic device 10 is configured to meet the standard of general commercial specifications, the temperature threshold values of the system states corresponding to the first test, the second test, and the third test can respectively be set to 95° C., 97° C., and 100° C. If the electronic device 10 is configured to meet the specification standards of military or industrial applications, the temperature threshold values of the system states corresponding to the first test, the second test, and the third test could respectively be set to 97° C., 98° C., and 100° C. The threshold values are also protection points of the electronic device at an extreme temperature. Other than the execution of the test, when the temperature of the CPU 110 is indeed increased to the above temperature threshold values, the microcontroller 130 executes the same procedure as each test. In an embodiment of the invention, the value of each of the above protection points (i.e., temperature threshold value) is recorded in a basic input/output system (BIOS, not shown) of the electronic device 10. The microcontroller 130 is connected to the BIOS unit and derives the values of each of the above protection points from the BIOS unit.

Moreover, in general, each of the above protection points (i.e., temperature threshold values) is set in the microcontroller 130 of the electronic device 10 at the same time. In other words, in terms of 97° C., 98° C., and 100° C. of the above commercial specifications, when the temperature of the CPU 110 reaches 95° C., the microcontroller 130 transmits a control signal to the CPU 110 such that the operating system can enter the S4 state; when the temperature of the CPU 110 is continuously increased to 97° C., the microcontroller 130 transmits a control signal to the CPU 110 such that the operating system is shut down and enters the S5 state; and when the temperature of the CPU 110 is 100° C., the microcontroller 130 directly shuts down the power output to the CPU 110 or shuts down the power of the electronic device 10.

In conventional art, in the testing method in which the fan 120 is disabled to increase the temperature of the CPU of the electronic device 10, the temperature is increased relatively slowly, and although a false positive caused by the fast rising temperature of the CPU can be prevented, other drawbacks are still present. For instance, before the above upper limit of temperature (i.e., temperature threshold value) is reached (such as 95° C.), the CPU 110 may start the mechanism of frequency reduction due to the operation of the internal protection mechanism thereof to prevent the CPU 110 from operating at a fast working frequency under an excessive temperature. In this way, the operating system operated by the CPU 100 is operated at a slow speed, even getting slower with an increase of temperature, and the time of entering the hibernation mode (entering the S4 state) or the soft shutdown (entering the S5 state) that need to be performed in the action of a test of the CPU 110 is also increased, such as exceeding 200 seconds. In this way, the temperature of the CPU 110 is already increased to the temperature threshold value corresponding to the S5 state before the action of the operating system entering the S4 state is complete, thus causing the test and the action thereof corresponding to the subsequent temperature threshold value to start by mistake.

Therefore, to ensure that the actions corresponding to each protection point (i.e., temperature threshold value) can all be activated when the temperature of the CPU achieves different protection points. In the present embodiment, each test can be configured to be independent from the others. That is, when one of the tests is executed (i.e., the first test is executed), the temperature threshold values corresponding to the other system states (i.e., the temperature threshold values of the second test and the third test) are all not considered by the microcontroller 130 to start the corresponding action (such as the soft shutdown action of the second test and the hard shutdown action of the third test). That is, when a test is performed, the microcontroller 130 disables the entering actions of the system states other than the system state corresponding to the test performed. However, the invention is not limited to the above configuration.

Moreover, in the invention, if the test corresponds to a work mode (such as the first test and the second test) of the operating system, the microcontroller 130 further enables the fan 120 (such as by transmitting the control signal CS to the fan 120) when the action of the test is executed. Such that the CPU 110 enters the sleep mode or the shutdown mode of the operating system in a circumstance in which a cooling mechanism is included. In this way, in comparison to the above known testing method in which the fan 120 is simply shut down, in the method provided in the invention, the situation in which the electronic device 10 faces an extreme temperature environment can be more realistic.

Figure 3:
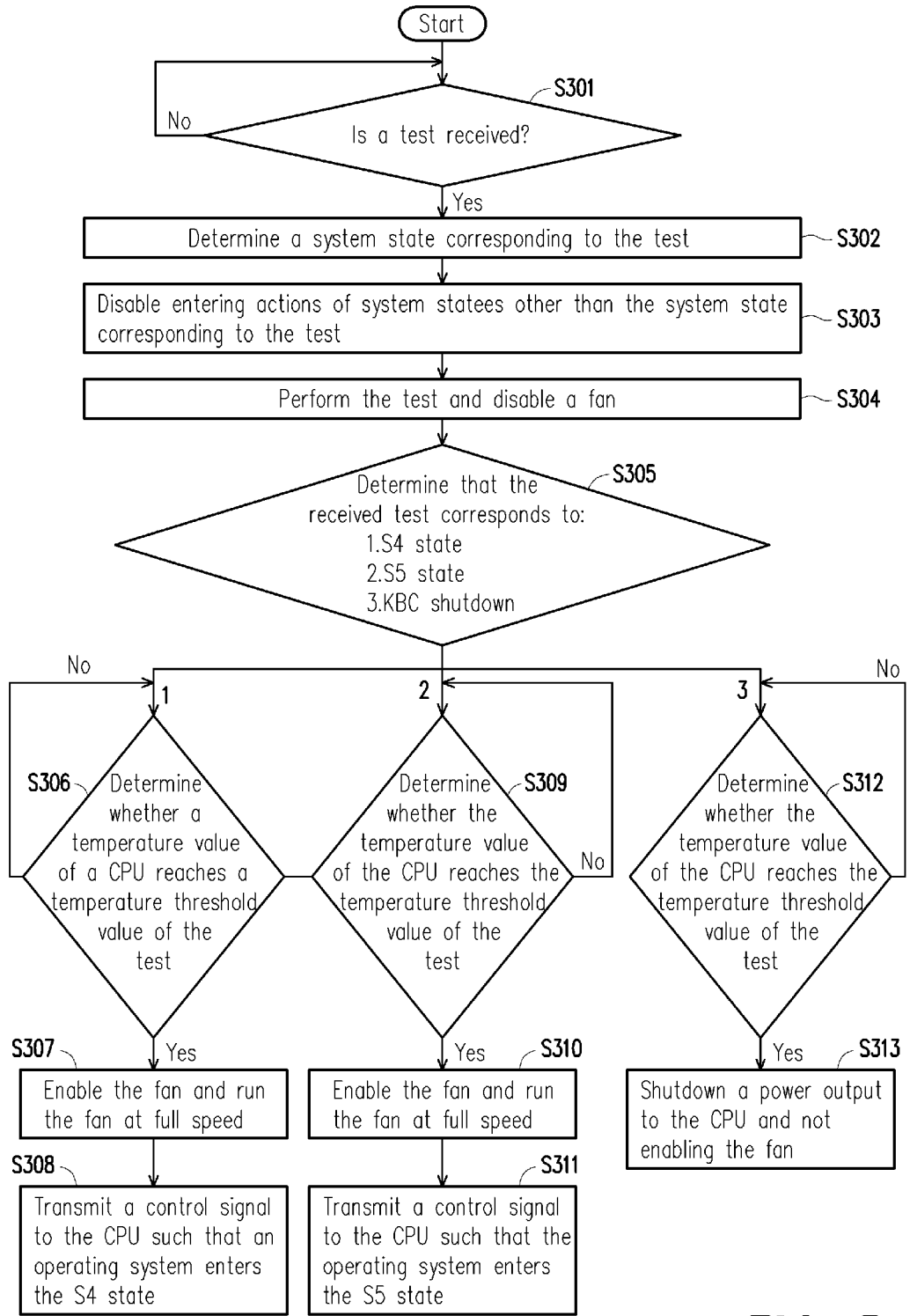
FIG. 3 is a method flowchart of a testing method illustrated according to an embodiment of the invention.

FIG. 3 is a method flowchart of a testing method illustrated according to an embodiment of the invention. In particular, in comparison to the embodiment of FIG. 1, the embodiment of FIG. 3 provides a more detailed implementation. Moreover, similar to the above embodiments, in the present embodiment, the hibernation mode corresponds to the S4 state of entering the ACPI and the shutdown mode corresponds to the S5 state of the ACPI. In the present embodiment, the microcontroller 130 is implemented by a keyboard controller (KBC), and the hard shutdown of the third test corresponds to the procedure of KBC shutdown. Referring to both FIG. 2 and FIG. 3, first, the microcontroller 130 (i.e., KBC) continuously determines whether any operating command including a test is received (step S301). In particular, the operating command can be transmitted by an application program in the operating system operated by the CPU 110, and can also be derived from an external device by the microcontroller 130 via a connecting interface, and the invention is not limited to the above.

When the microcontroller 130 determines the operating command including a test is received, the microcontroller 130 derives the test from the operating command. After the test is derived, the microcontroller 130 first determines the system state corresponding to the received test, such as the S4 state, the S5 state, or the hard shutdown (KBC shutdown in the present embodiment) corresponding to the above first test to third test (step S302). Then, the microcontroller 130 disables the entering actions of the system states other than the system state corresponding to the test (step S303), such as if the test is the first test, the entering actions corresponding to the second test and the third test are disabled.

Then, the microcontroller 130 executes the test and disables the fan 120 (step S304), such that the temperature of the CPU 110 can be increased to the temperature threshold value needed for the test due to a lack of effective cooling mechanism. Then, the microcontroller 130 determines the received test corresponds to: option 1.) the S4 state (corresponds to the first test of the hibernation mode), option 2.) the S5 state (corresponds to the second test of the shutdown mode), or option 3.) the KBC shutdown mode (corresponds to the third test of the hard shutdown) (step S305).

When the microcontroller 130 determines the received test corresponds to the S4 state (step S305, option 1.), the microcontroller 130 continuously determines whether the temperature value of the CPU 110 reaches the temperature threshold value in the test (step S306). When the microcontroller 130 determines the temperature value of the CPU 110 reaches the temperature threshold value corresponding to the S4 state (step S306, yes), the microcontroller 130 can first enable the fan, and simulate the electronic device 10 under an extreme temperature environment such that the fan runs at full speed (step S307). The microcontroller 130 can transmit a control signal to the CPU 110, such that the operating system operated by the CPU 110 enters the S4 state (step S308). In step S308, whether the operating system is completely entered the S4 state is further confirmed to complete the test. The tester is informed of the results in an arbitrary method.

When the microcontroller 130 determines the received test corresponds to the S5 state (step S305, option 2.), the microcontroller 130 continuously determines whether the temperature value of the CPU 110 reaches the temperature threshold value in the test (step S309). When the microcontroller 130 determines the temperature value of the CPU 110 reaches the temperature threshold value corresponding to the S5 state (step S309, yes), the microcontroller 130 can first enable the fan, and simulate the electronic device 10 under an extreme temperature environment such that the fan runs at full speed (step S310). The microcontroller 130 can transmit a control signal to the CPU 110, such that the operating system operated by the CPU 110 enters the S5 state (step S311). In step S311, whether the operating system is completely entered the S5 state is further confirmed to complete the test. The tester is informed of the results in an arbitrary method.

Moreover, when the microcontroller 130 determines the received test corresponds to the KBC shutdown mode (step S305, option 3), the microcontroller 130 can learn the current test corresponds to the above described third test, and the microcontroller 130 determines whether the temperature value of the CPU reaches the temperature threshold value of the test (i.e., third test) without enabling the fan 120 (step S312). When the microcontroller 130 determines the temperature value of the CPU reaches the temperature threshold value of the test (step S312, yes), the microcontroller 130 does not enable the fan 120 and instantly shuts down power output to the CPU 110, thus completing the action corresponding to the hard shutdown of the electronic device (step S313).

Figure 4:
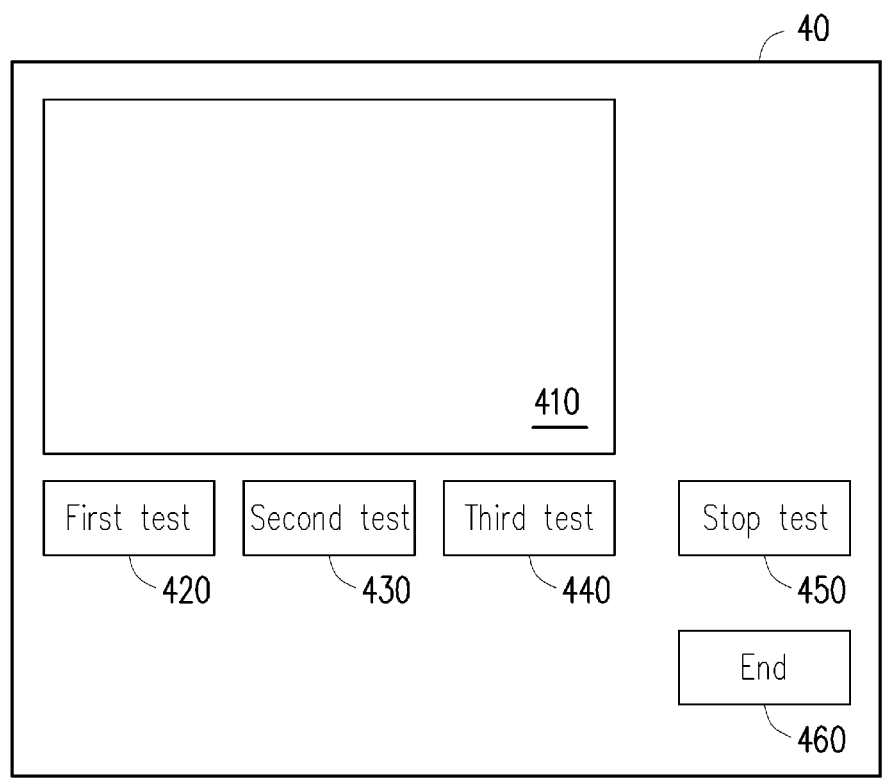
FIG. 4 is a user interface schematic of an application program corresponding to a test illustrated according to an embodiment of the invention.

As described in the above embodiment shown in FIG. 3, the operating command can be generated by an application program in the operating system operated by the CPU 110 and transmitted to the microcontroller 130. FIG. 4 is a user interface schematic of an application program corresponding to a test illustrated according to an embodiment of the invention. Referring to FIG. 4, a user interface 40 includes a state information display column 410 and buttons 420 to 460. In particular, the buttons 420 to 460 respectively correspond to the functions of starting the first test, starting the second test, starting the third test, stopping the test being performed, and ending the program. For instance, when the user pushes the button 420 in the user interface 40 of the application program via the user interface of the operating system, the CPU 110 generates an operating command including the first test and transmits the operating command to the microcontroller 130. After the microcontroller 130 receives the first test, the execution of the first test can be started. At the same time, during execution, the temperature change and other monitoring information of each hardware element can be returned to the CPU 110 via the microcontroller 130 and be represented in the state information display column 410.

In the present embodiment, the state information display column 410 can display real time monitoring information such as the temperature value of the CPU 110, the temperature value of a battery, the temperature value of a substrate in the electronic device 10, temperature values of other heat-emitting elements in the electronic device 10, and whether the fan 120 is currently running and the speed thereof, and the invention is not limited thereto. If the user presses the button 450 via the user interface 40, the microcontroller 130 can stop the test due to a control signal corresponding to stopping a test transmitted from the CPU 110 and enable the fan again. When the user pushes the button 450 via the user interface 40, the present program can be shutdown.

Moreover, the application program can also record the number of sleeps, soft shutdowns, and hard shutdowns of the operating system (via a method such as setting a flag before or after sleeping or shutting down, or receiving information from the microcontroller 130), and display such information through the state information column 410. In this way, the user can learn whether the test is successful via the state information column 410 directly. For instance, the user presses the button 420, and looks back at the electronic device 10 after a certain amount of time, and wakes the electronic device 10 from sleep. Here, the user can also confirm whether the electronic device 10 completed the first test via the number of sleeps displayed on the state information column 410, etc.

Based on the above, the invention provides a testing method and an electronic device, such that the process of a test of the electronic device in a harsh temperature environment can be simplified (such as the above first to third tests), and a false positive of protection mechanism caused by human error can be effectively reduced via a test managed by an application program of the operating system. Moreover, in the case that the test corresponds to the work mode of the operating system, the microcontroller can also correspondingly enable the fan again, such that the electronic device during testing can be closer to an electronic device truly in a harsh temperature environment.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A testing method, adapted for an electronic device operating an operating system at a particular temperature environment, the operating system having a plurality of system states, the method comprising:
   determining whether an operating command is received; and
   when the operating command is received, deriving one of a plurality of tests from the operating command, executing the derived test, and disabling a fan of the electronic device;
   wherein each of the tests respectively corresponds to one of the system states and comprises a temperature threshold value corresponding to the corresponding system state and an entering action of the corresponding system state;
   wherein when the system state of the derived test is a work mode of the operating system, the derived test comprises:
     continuously monitoring a temperature value of a central processing unit of the electronic device; and
     enabling the fan and executing the entering action of the system state of the derived test when the temperature value of the central processing unit of the electronic device reaches the temperature threshold value, such that the operating system enters the work mode of the system state of the derived test.

2. The method of claim 1, wherein the derived test further comprises:
   disabling the entering action of each of the system states other than the system state of the derived test.

3. The method of claim 1, wherein the step of enabling the fan and executing the entering action of the system state of the derived test comprises:
   enabling the fan and transmitting a control signal to the central processing unit according to the work mode of the system state of the derived test such that the operating system enters the work mode of the system state of the derived test.

4. The method of claim 1, wherein the plurality of system states further comprise a hard shutdown of the electronic device, and when the system state of the derived test is the hard shutdown of the electronic device, the derived test comprises:
   continuously monitoring the temperature value of the central processing unit of the electronic device; and
   executing the entering action of the system state of the derived test when the temperature value of the central processing unit of the electronic device reaches the temperature threshold value, wherein the entering action comprises:
     shutting down a power output to the central processing unit of the electronic device and not enabling the fan.

5. The method of claim 1, wherein the working mode is selected from a plurality of working modes of the operating system comprising a hibernation mode or a soft shutdown mode.

6. The method of claim 5, wherein the plurality of system states comprise both the hibernation mode and the soft shutdown mode, and the plurality of tests comprise a first test corresponding to the hibernation mode and a second test corresponding to the soft shutdown mode, wherein the temperature threshold value of the first test is lower than the temperature threshold value of the second test.

7. The method of claim 1, wherein the temperature threshold value of the derived test is derived from a basic input/output system (BIOS) of the electronic device.

8. The method of claim 1, wherein the step of determining whether the operating command is received comprises:
   determining whether the operating command is received from an application program in the operating system.

9. An electronic device, comprising:
   a central processing unit operating an operating system having a plurality of system states;
   a fan fixed adjacent to the central processing unit;
   a microcontroller coupled to the central processing unit and the fan;
   wherein the microcontroller determines whether an operating command is received;
   the microcontroller deriving one of a plurality of tests from the operating command, executing the derived test, and disabling the fan when the operating command is received, wherein each of the tests respectively corresponds to one of the plurality of system states, and comprises a temperature threshold value corresponding to the corresponding system state and an entering action of the corresponding system state, wherein when the system state of the derived test is a work mode of the operating system, the derived test comprises:

continuously monitoring a temperature value of the central processing unit of the electronic device; and enabling the fan and executing the entering action of the system state of the derived test when the temperature value of the central processing unit of the electronic device reaches the temperature threshold value, such that the operating system enters the work mode of the system state of the derived test.

10. The electronic device of claim 9, wherein the derived test further comprises:

disabling the entering action of each of the system states other than the system state of the derived test.

11. The electronic device of claim 9, wherein:

when the derived test corresponds to the work mode of the operating system, and when the temperature value of the central processing unit reaches the temperature threshold value, the microcontroller enables the fan and transmits a control signal to the central processing unit according to the work mode of the system state of the derived test such that the operating system enters the work mode of the system state of the derived test.

12. The electronic device of claim 9, wherein:

the plurality of system states further comprise a hard shutdown of the electronic device, and when the derived test is the hard shutdown of the electronic device, the derived test comprises:

continuously monitoring the temperature value of the central processing unit of the electronic device via the microcontroller; and executing the entering action of the system state of the derived test via the microcontroller when the temperature value of the central processing unit reaches the temperature threshold value, wherein the entering action comprises:

shutting down a power output to the central processing unit and not enabling the fan.

13. The electronic device of claim 11, wherein:

the working mode is selected from a plurality of working modes of the operating system comprising a hibernation mode or a soft shutdown mode.

14. The electronic device of claim 13, wherein:

the plurality of system states comprise both the hibernation mode and the soft shutdown mode, and the plurality of tests comprise a first test corresponding to the hibernation mode and a second test corresponding to the soft shutdown mode, wherein the temperature threshold value of the first test is lower than the temperature threshold value of the second test.

15. The electronic device of claim 9, wherein the electronic device further comprises:

a basic input/output system (BIOS) coupled to the microcontroller, wherein the microcontroller derives the temperature threshold value of the derived test from the BIOS.

16. The electronic device of claim 9, wherein:

the microcontroller determines whether the operating command is received from an application program in the operating system operated by the central processing unit.

17. The method of claim 1, wherein the temperature threshold value of the test corresponding to each system state is different.

18. The electronic device of claim 9, wherein the temperature threshold value of the test corresponding to each system state is different.

19. A testing method, adapted for an electronic device operating an operating system at a particular temperature environment, the operating system having a plurality of system states comprising a plurality of work modes and a hard shutdown mode, the work modes comprising a hibernation mode and/or a soft shutdown mode, the method comprising:

determining whether an operating command is received; and when the operating command is received, deriving one of a plurality of tests from the operating command, executing the derived test, and disabling a fan of the electronic device;

wherein each of the tests respectively corresponds to one of the system states and comprises a temperature threshold value corresponding to the corresponding system state and an entering action of the corresponding system state;

wherein when the system state of the derived test is the work mode of the operating system, the derived test comprises:

continuously monitoring a temperature value of a central processing unit of the electronic device; and enabling the fan and executing the entering action of the system state of the derived test when the temperature value of the central processing unit of the electronic device reaches the temperature threshold value, such that the operating system enters the work mode of the system state of the derived test; and when the system state of the derived test is the hard shutdown of the electronic device, the derived test comprises:

continuously monitoring the temperature value of the central processing unit of the electronic device; and executing the entering action of the system state of the derived test when the temperature value of the central processing unit of the electronic device reaches the temperature threshold value, wherein the entering action comprises:

shutting down a power output to the central processing unit of the electronic device and not enabling the fan.

20. The method of claim 19, wherein the temperature threshold value of the test corresponding to each system state is different.

* * * * *